United States Patent
Doyle et al.

(10) Patent No.: US 9,357,686 B2
(45) Date of Patent: May 31, 2016

(54) DISPENSING APPARATUS HAVING SUBSTRATE INVERTER SYSTEM AND CLAMPING SYSTEM, AND METHOD FOR DISPENSING A VISCOUS MATERIAL ON A SUBSTRATE

(71) Applicant: Illinois Tool Works Inc., Glenview, IL (US)

(72) Inventors: Dennis G. Doyle, Shrewsbury, MA (US); Thomas E. Robinson, Walpole, MA (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 14/080,169

(22) Filed: Nov. 14, 2013

(65) Prior Publication Data

US 2015/0132482 A1    May 14, 2015

(51) Int. Cl.
*B05C 13/00* (2006.01)
*H05K 13/04* (2006.01)
*H05K 13/00* (2006.01)

(52) U.S. Cl.
CPC ............ *H05K 13/0469* (2013.01); *B05C 13/00* (2013.01); *H05K 13/0061* (2013.01)

(58) Field of Classification Search
None
See application file for complete search history.

(56) References Cited

U.S. PATENT DOCUMENTS

| | | | |
|---|---|---|---|
| 4,565,400 A * | 1/1986 | Nakashima et al. | 294/197 |
| 4,871,584 A | 10/1989 | Weber | |
| 5,044,900 A | 9/1991 | Cavallaro | |
| 5,474,641 A * | 12/1995 | Otsuki et al. | 438/694 |
| 5,795,390 A | 8/1998 | Cavallaro | |
| 5,819,983 A | 10/1998 | White et al. | |
| 5,837,892 A | 11/1998 | Cavallaro et al. | |
| 5,886,494 A | 3/1999 | Prentice et al. | |
| 5,903,125 A | 5/1999 | Prentice et al. | |
| 5,918,648 A | 7/1999 | Carr et al. | |
| 5,957,343 A | 9/1999 | Cavallaro | |
| 5,971,227 A | 10/1999 | White et al. | |

(Continued)

FOREIGN PATENT DOCUMENTS

| | | |
|---|---|---|
| DE | 4107224 C1 | 6/1992 |
| DE | 10 2005 045 161 A1 | 4/2007 |

(Continued)

OTHER PUBLICATIONS

International Search Report and the Written Opinion of the International Searching Authority from corresponding PCT/US2014/052200 mailed Jan. 28, 2015.

*Primary Examiner* — Charles Capozzi
(74) *Attorney, Agent, or Firm* — Lando & Associates, LLP

(57) ABSTRACT

A dispenser, which is capable of dispensing viscous material on a substrate having a top surface and a bottom surface, includes a frame, a gantry system, and a dispensing unit. The gantry system is configured to move the dispensing unit in x-axis, y-axis, and z-axis directions. The dispenser further includes a substrate support assembly configured to support the substrate in a dispense position to dispense material on the top surface of the substrate and on the bottom surface of the substrate. The substrate support assembly includes a clamping system and an inverter system. The inverter system is configured to rotate the clamping system about an axis that is parallel to the y-axis direction between a first position in which the top surface of the substrate is in the dispense position and a second position in which the bottom surface of the substrate is in the dispense position.

9 Claims, 14 Drawing Sheets

(56) References Cited

U.S. PATENT DOCUMENTS

| | | |
|---|---|---|
| 5,985,029 A | 11/1999 | Purcell |
| 6,007,631 A | 12/1999 | Prentice et al. |
| 6,017,392 A | 1/2000 | Cavallaro |
| 6,025,689 A | 2/2000 | Prentice et al. |
| 6,056,190 A | 5/2000 | Foulke et al. |
| 6,073,748 A | 6/2000 | Douglas |
| 6,082,289 A | 7/2000 | Cavallaro |
| 6,085,943 A | 7/2000 | Cavallaro et al. |
| 6,093,251 A | 7/2000 | Carr et al. |
| 6,112,588 A | 9/2000 | Cavallaro et al. |
| 6,119,895 A | 9/2000 | Fugere et al. |
| 6,157,157 A | 12/2000 | Prentice et al. |
| 6,170,737 B1 | 1/2001 | Foulke et al. |
| 6,206,964 B1 | 3/2001 | Purcell et al. |
| 6,214,117 B1 | 4/2001 | Prentice et al. |
| 6,216,917 B1 | 4/2001 | Crouch |
| 6,224,671 B1 | 5/2001 | Cavallaro |
| 6,224,675 B1 | 5/2001 | Prentice et al. |
| 6,258,165 B1 | 7/2001 | Cavallaro |
| 6,322,854 B1 | 11/2001 | Purcell et al. |
| 6,371,339 B1 | 4/2002 | White et al. |
| 6,378,737 B1 | 4/2002 | Cavallaro et al. |
| 6,391,378 B1 | 5/2002 | Carr et al. |
| 6,395,334 B1 | 5/2002 | Prentice et al. |
| 6,412,328 B1 | 7/2002 | Cavallaro et al. |
| 6,427,903 B1 | 8/2002 | Foulke et al. |
| 6,444,035 B1 | 9/2002 | Nowak et al. |
| 6,514,569 B1 | 2/2003 | Crouch |
| 6,540,832 B2 | 4/2003 | Cavallaro |
| 6,541,063 B1 | 4/2003 | Prentice et al. |
| 6,641,030 B1 | 11/2003 | Freeman et al. |
| 6,644,238 B2 | 11/2003 | Watts et al. |
| 6,688,458 B2 | 2/2004 | Prentice et al. |
| 6,739,483 B2 | 5/2004 | White et al. |
| 6,775,879 B2 | 8/2004 | Bibeault et al. |
| 6,814,810 B2 | 11/2004 | Prentice et al. |
| 6,866,881 B2 | 3/2005 | Prentice et al. |
| 6,902,052 B2 | 6/2005 | Prentice et al. |
| 6,932,280 B2 | 8/2005 | Crouch |
| 7,404,861 B2 | 7/2008 | Prentice et al. |
| 7,833,572 B2 | 11/2010 | Read |
| 7,923,056 B2 | 4/2011 | Read |
| 7,980,197 B2 | 7/2011 | Prentice et al. |
| 8,136,705 B2 | 3/2012 | Tracy et al. |
| 8,230,805 B2 | 7/2012 | Read |
| 8,424,720 B2 | 4/2013 | Tracy et al. |
| 2003/0209560 A1 | 11/2003 | Hui et al. |
| 2004/0037690 A1* | 2/2004 | Kubo et al. ............... 414/741 |
| 2004/0129534 A1* | 7/2004 | Prentice et al. ........... 198/502.2 |
| 2006/0016462 A1* | 1/2006 | Asano ........................ 134/18 |
| 2006/0193969 A1 | 8/2006 | Prentice et al. |
| 2007/0281100 A1* | 12/2007 | Herre ............... B05B 13/0221 427/407.1 |
| 2008/0159617 A1 | 7/2008 | Yang et al. |
| 2008/0176003 A1* | 7/2008 | Tsutsumi et al. .......... 427/496 |
| 2008/0296311 A1* | 12/2008 | Read ............... H05K 13/0469 221/1 |
| 2012/0240658 A1 | 9/2012 | Tracy |
| 2012/0288635 A1 | 11/2012 | Tanabe et al. |
| 2013/0133574 A1 | 5/2013 | Doyle et al. |
| 2013/0136850 A1 | 5/2013 | Doyle et al. |
| 2013/0177702 A1 | 7/2013 | Crouch et al. |
| 2013/0247370 A1 | 9/2013 | Kawase et al. |

FOREIGN PATENT DOCUMENTS

| | | |
|---|---|---|
| DE | 112011104331 T5 | 10/2013 |
| EP | 1 937 045 A1 | 6/2008 |
| KR | 20100079524 A | 7/2010 |
| WO | 93/16812 A1 | 9/1993 |
| WO | 00/65316 A1 | 11/2000 |
| WO | 2008/020974 A2 | 2/2008 |

* cited by examiner

DISPENSING APPARATUS HAVING SUBSTRATE INVERTER SYSTEM AND CLAMPING SYSTEM, AND METHOD FOR DISPENSING A VISCOUS MATERIAL ON A SUBSTRATE

RELATED APPLICATION

This application relates to U.S. patent application Ser. No. 14/080,345 entitled DISPENSING APPARATUS HAVING SUBSTRATE INVERTER SYSTEM AND ROLLER SYSTEM, AND METHOD FOR DISPENSING A VISCOUS MATERIAL ON A SUBSTRATE, by Dennis G. Doyle, filed on even date herewith, and U.S. patent application Ser. No. 14/080,174 entitled DISPENSING APPARATUS HAVING TRANSPORT SYSTEM AND METHOD FOR TRANSPORTING A SUBSTRATE WITHIN THE DISPENSING APPARATUS, by Dennis G. Doyle and Thomas E. Robinson, filed on even date herewith. All of these related applications are incorporated herein by reference.

BACKGROUND OF THE DISCLOSURE

1. Field of the Invention

The invention relates generally to methods and apparatus for dispensing a viscous material on a substrate, such as a printed circuit substrate.

2. Discussion of Related Art

There are several types of prior art dispensing systems or dispensers used for dispensing metered amounts of liquid or paste for a variety of applications. One such application is the assembly of integrated circuit chips and other electronic components onto circuit board substrates. In this application, automated dispensing systems are used for dispensing dots of liquid epoxy or solder paste, or some other related material, onto circuit boards. Automated dispensing systems are also used for dispensing lines of underfill materials and encapsulents, which mechanically secure components to the circuit board. Underfill materials and encapsulents are used to improve the mechanical and environmental characteristics of the assembly.

FIG. 1 schematically illustrates a known dispenser, which is generally indicated at 10. The dispenser 10 is used to dispense a viscous material (e.g., an adhesive, encapsulent, epoxy, solder paste, underfill material, etc.) or a semi-viscous material (e.g., soldering flux, etc.) onto an electronic substrate 12, such as a printed circuit board or semiconductor wafer. The dispenser 10 may alternatively be used in other applications, such as for applying automotive gasketing material or in certain medical applications. It should be understood that references to viscous or semi-viscous materials, as used herein, are exemplary and intended to be non-limiting. In one embodiment, the dispenser 10 includes first and second dispensing units or heads, generally indicated at 14 and 16, respectively, and a controller 18 to control the operation of the dispenser. Although two dispensing units are shown, it should be understood that one or more dispensing units may be provided.

The dispenser 10 may also include a frame 20 having a base or support 22 for supporting the substrate 12, a dispensing unit gantry 24 movably coupled to the frame 20 for supporting and moving the dispensing units 14, 16, and a weight measurement device or weigh scale 26 for weighing dispensed quantities of the viscous material, for example, as part of a calibration procedure, and providing weight data to the controller 18. A conveyor system (not shown) or other transfer mechanism, such as a walking beam, may be used in the dispenser 10 to control loading and unloading of substrates to and from the dispenser. The gantry 24 can be moved using motors under the control of the controller 18 to position the dispensing units 14, 16 at predetermined locations over the substrate. The dispenser 10 may include a display unit 28 connected to the controller 18 for displaying various information to an operator. There may be an optional second controller for controlling the dispensing units.

Prior to performing a dispensing operation, as described above, the substrate, e.g., the printed circuit board, must be aligned or otherwise in registration with a dispensing unit of the dispenser. The dispenser further includes a vision system 30, which is coupled to a vision system gantry 32 movably coupled to the frame 20 for supporting and moving the vision system. Although shown separately from the dispensing unit gantry 24, the vision system gantry 32 may utilize the same gantry system as the dispensing units 14, 16. As described, the vision system 30 is employed to verify the location of landmarks, known as fiducials or other features and components, on the substrate. Once located, the controller can be programmed to manipulate the movement of one or both of the dispensing units 14, 16 to dispense material on the electronic substrate. The dispense operation may be controlled by the controller 18, which may include a computer system configured to control material dispensers. In another embodiment, the controller 18 may be manipulated by an operator.

In some embodiments, the dispenser 10 may operate as follows. The circuit board may be loaded into the dispenser 10 in a depositing position using the conveyor system. The circuit board is aligned with the dispensing units 14, 16 by using the vision system 30. The dispensing units 14, 16 may then be initiated by the controller 18 to perform a deposit operation in which material is deposited at precise locations on the circuit board. Once the dispensing units 14, 16 have performed a depositing operation, the circuit board may be transported by the conveyor system from the dispenser 10 so that a second, subsequent circuit board may be loaded into the material deposition system. The dispensing units 14, 16 may be constructed to be quickly removed and replaced with other units. The dispenser 10 is capable of dispensing material on only one side of the circuit board.

Sometimes, it is desirable to dispense such materials on both sides of the substrate. One such dispenser is offered by Protec Co., Ltd of Incheon, Korea, and incorporates a substrate support that rotates about an axis that is transverse to a direction that the substrate travels through the dispenser. With this dispenser, belts that engage edges of the substrate move the substrate through the dispenser. With this arrangement, it is difficult to dispense material near edges of the substrate since the belts interfere with the dispensing unit when attempting to dispense material near the edges of the substrate.

SUMMARY OF THE DISCLOSURE

One aspect of the present disclosure is directed to a dispenser for dispensing viscous material on a substrate having a top surface and a bottom surface. In one embodiment, the dispenser comprises a frame, a gantry system coupled to the frame, and a dispensing unit coupled to the gantry system. The gantry system is configured to move the dispensing unit in x-axis, y-axis, and z-axis directions. The dispenser further comprises a substrate support assembly coupled to the frame and configured to support the substrate in a dispense position to dispense material on the top surface of the substrate and on the bottom surface of the substrate. The substrate support assembly includes a clamping system configured to receive and support the substrate in the dispense position, and an inverter system coupled to the frame and the clamping system. The inverter system is configured to rotate the clamping system about an axis that is parallel to the y-axis direction between a first position in which the top surface of the substrate is in the dispense position and a second position in which the bottom surface of the substrate is in the dispense position.

Embodiments of the dispenser further include configuring the inverter system to move in a z-axis direction. The inverter system may include a support plate, an elevator plate movably coupled to the support plate, a z-axis drive assembly configured to move the elevator plate in the z-axis direction, and a rotational drive assembly configured to rotate the clamping system. The z-axis drive assembly may include at least one bearing coupled to the frame by a ball screw, and a motor configured to drive the rotation of the ball screw to move the elevator plate. The clamping system may include a first clamping assembly configured to clamp one edge of the substrate and a second clamping assembly configured to clamp an opposite edge of the substrate. For each of the first clamping assembly and the second clamping assembly, the rotational drive assembly may include a pivot secured to the clamping assembly, a belt coupled to the pivot, and a motor configured to drive the belt to rotate the pivot. Each clamping assembly may include an upper clamping member and a lower clamping member, the upper and lower clamping members being configured to clamp an edge of the substrate. The upper and lower clamping members are spring loaded to be biased to a clamping position. The upper clamping member includes a first cam follower configured to engage a rise on a cam provided on the support to move the upper clamp to an open position, and the lower clamping member includes a second cam follower configured to engage the cam to move the lower clamping member to an open position. When the upper clamping member or the lower clamping member is in its clamping position, a substrate supported by the clamping system is in a top justified position. The further may include at least one sensor configured to determine an orientation of at least one of the upper clamping member and the lower clamping member. The substrate support assembly may include two lanes, a front lane and a rear lane, and the dispenser further may comprise an upstream conveyor system configured to deliver substrates to the front and rear lanes of the dispenser and a downstream conveyor system configured to remove substrates from the front and rear lanes of the dispenser.

Another aspect of the disclosure is directed to a method of depositing material on a top surface of a substrate and on a bottom surface of the substrate. In one embodiment, the method comprises: delivering the substrate to a substrate support assembly of a dispenser, the substrate support assembly including a clamping system configured to receive and support the substrate in a dispense position, and an inverter system coupled to the frame and the clamping system, the inverter system being configured to rotate the clamping system about an axis that is parallel to a y-axis direction between a first position in which the top surface is in a dispense position and a second position in which the bottom surface is in a dispense position; performing a dispense operation on the top surface of the substrate; rotating the substrate so that the bottom surface of the substrate faces upwardly; raising the substrate; performing a dispense operation on the bottom surface of the substrate; and removing the substrate from the substrate support assembly of the dispenser.

Embodiments of the method further include, prior to rotating the substrate, lowering the substrate. The method further may include, prior to performing the dispense operation on the top surface of the substrate, clamping opposing edges of the substrate with the clamping system. Clamping the opposing edges of the substrate may be achieved by raising the substrate to the dispense position so that spring-biased clamping members of the clamping system engage the substrate. The method further may include, prior to removing the substrate from the substrate support assembly, unclamping the opposing edges of the substrate. Unclamping opposing edges of the substrate may be achieved by lowering the substrate from the dispense position so that spring-biased clamping members of the clamping system disengage the substrate. Delivering the substrate to the substrate support assembly of the dispenser may include delivering the substrate to the dispense position through a first lane. The method further may include delivering another substrate to the substrate support assembly of the dispenser through a second lane.

BRIEF DESCRIPTION OF THE DRAWINGS

For a better understanding of the disclosure, reference is made to the figures which are incorporated herein by reference and in which.

DETAILED DESCRIPTION OF THE PREFERRED EMBODIMENTS

Figure 1:
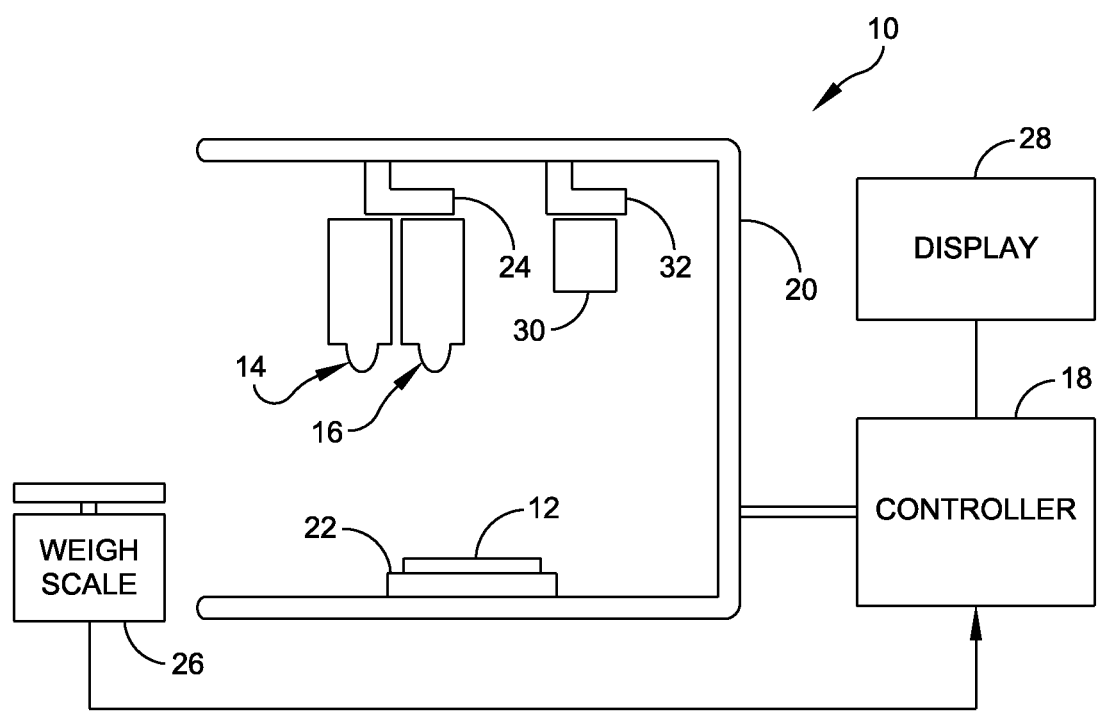
FIG. 1 is a schematic view of a prior art dispenser.

For the purposes of illustration only, and not to limit the generality, the disclosure will now be described in detail with reference to the accompanying figures. This disclosure is not limited in its application to the details of construction and the arrangement of components set forth in the following description or illustrated in the drawings. The disclosure is capable of other embodiments and of being practiced or being carried out in various ways. Also the phraseology and terminology used herein is for the purpose of description and should not be regarded as limiting. The use of "including," "comprising,"

"having," "containing," "involving," and variations thereof herein, is meant to encompass the items listed thereafter and equivalents thereof as well as additional items.

For purposes of illustration, embodiments of the present disclosure are described below, with reference to a dispenser used to dispense solder paste onto a circuit board. The apparatus and associated methods may also be used in other applications requiring dispensing of other viscous or dispensing materials, such as glues, adhesives, and encapsulants on a variety of substrates. For example, the apparatus may be used to dispense epoxy for use as underfill for chip-scale packages. In certain embodiments, the dispensing units may be of the type offered by Speedline Technologies, Inc. of Franklin, Mass.

This present disclosure is directed to a dispenser including a substrate support assembly having an inverter system provided within the dispenser, the inverter system being designed to engage the substrate without interfering with a dispensing unit when dispensing material near edges of the substrate. The dispenser disclosed herein is capable of inverting the substrate, thereby enabling the dispensing unit to dispense material on both sides of the substrate within five millimeters (mm) from the edge of the substrate with an auger-type dispensing unit and within eight mm from the edge of the substrate with a jetter-type dispensing unit. Since traditional transport belts interfere with the dispensing unit in the space above the substrate, the dispenser, in one embodiment, includes a clamping system to secure the substrate in the dispense position. To deliver the substrate to the dispense position within the dispenser, the dispenser includes a combination of substrate pushers configured to push an edge of the substrate and belts since belts alone cannot completely transport the substrate onto or off of the clamping system of the substrate support assembly. In another embodiment, the substrate support assembly of the dispenser includes a roller system along with the inverter system. Such a roller system incorporates the use of rollers, and in one preferred embodiment, tapered rollers. With both the clamping system and the roller system, each system has the ability to dispense close to the edge of the substrate on both the top and bottom surfaces of the substrate.

With the clamping system, the clamping system has no mechanism that will drive the substrate onto the clamping system completely, thereby necessitating the use of the pusher. Without the pusher, the belts are capable of moving the substrate about 65% of the way to the dispense position before the belts start slipping thereby preventing the substrate from reaching the dispense position. The pusher and the belts are synchronized and work together to prevent and/or account for any belt slippage. When the belts start to lose grip on the substrate, the pusher keeps the substrate moving until it is fully delivered to the dispense position within the clamping system of the substrate support assembly. This pusher is configured to lift above the rails since there is a pre-heat chuck in a preheat zone. In a certain embodiment, the upstream pusher is an air cylinder with a finger that contacts the substrate.

Since there are no belts provided in the clamping system, a similar problem arises when removing the substrate from the clamping system. The pusher moves in synchronized motion with the downstream conveyor belts. The pusher actually pushes the substrate the whole way so that there is no relative motion between the belts and substrate such that the belts wear away prematurely. This pusher resides under the conveyor so that the pusher can maintain a clear path above the inverter for the dispensing unit. The pusher is also capable of retracting such that the pusher is located beneath the conveyor rails so that the pusher is not in the way when the conveyor starts to move. In a certain embodiment, the downstream pusher is an air cylinder with a finger that contacts the substrate.

The present disclosure is directed to the construction of the clamping system and the pusher and belt assemblies, and addresses the issues involving the limited space that is available in the dispenser for these systems. The inverter system is configured to rotate the substrate once the substrate is secured in the dispense position. In one embodiment, the inverter system is belt driven by a stepper motor, and has a ten-to-one ratio, such that an accurate transport angle is achieved. The complexity of these systems is that they need to be synchronized (spin together without causing any distortion to the substrate). This is achieved by using two different stepper motors, both driven with the same step pulses coming out of a drive module.

The inverter system is capable of lowering the substrate prior to rotating the substrate while avoiding a collision within the dispense position with the dispensing unit and/or gantry. While rotating a substrate in one lane, the dispensing unit of the dispenser can continue to dispense on a substrate located in an adjacent lane. The inverter system includes linear motion devices having linear bearings, ball screws and stepper motors to drive them. The clamping system is small enough to enable the dispensing unit to get close to the edge of the substrate since there is very little space for the dispensing unit to effectively operate. The clamping system positions the substrate at a dispense height regardless of the orientation and a thickness of the substrate. Clamping members of the clamping system are open at a transport height so that the incoming substrate does not interfere with the clamping members when traveling over the clamping members. Once in position, the clamping members are moved to clamp the substrate during dispensing on the substrate and during rotation of the substrate. The clamping system is configured to be rigid and aligned tightly in both orientations and at transport and dispense heights.

Figure 2:
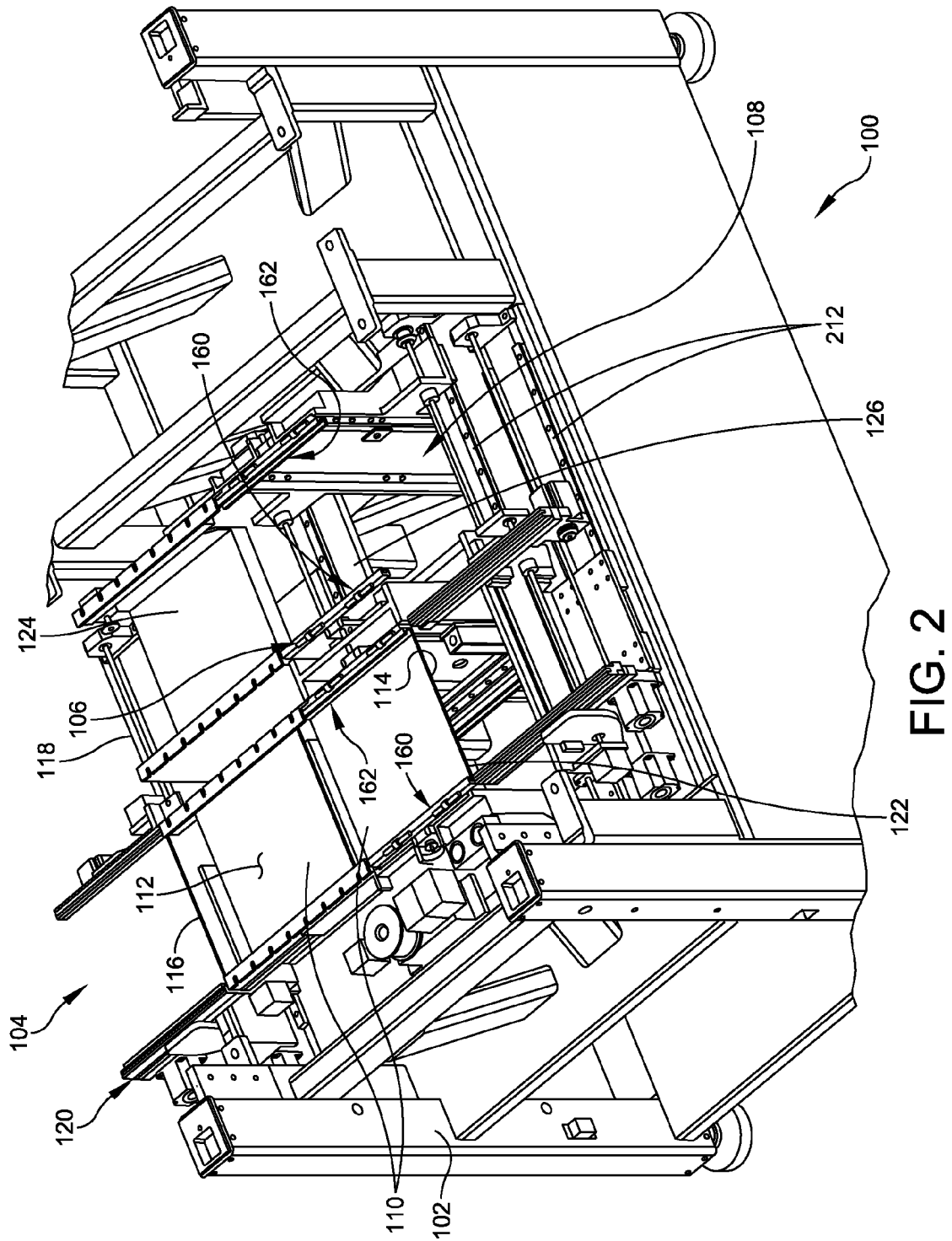
FIG. 2 is a partial top perspective view of a dispenser of an embodiment of the present disclosure with portions removed to better illustrate an inverter system and a clamping system of the dispenser.
Figure 3:
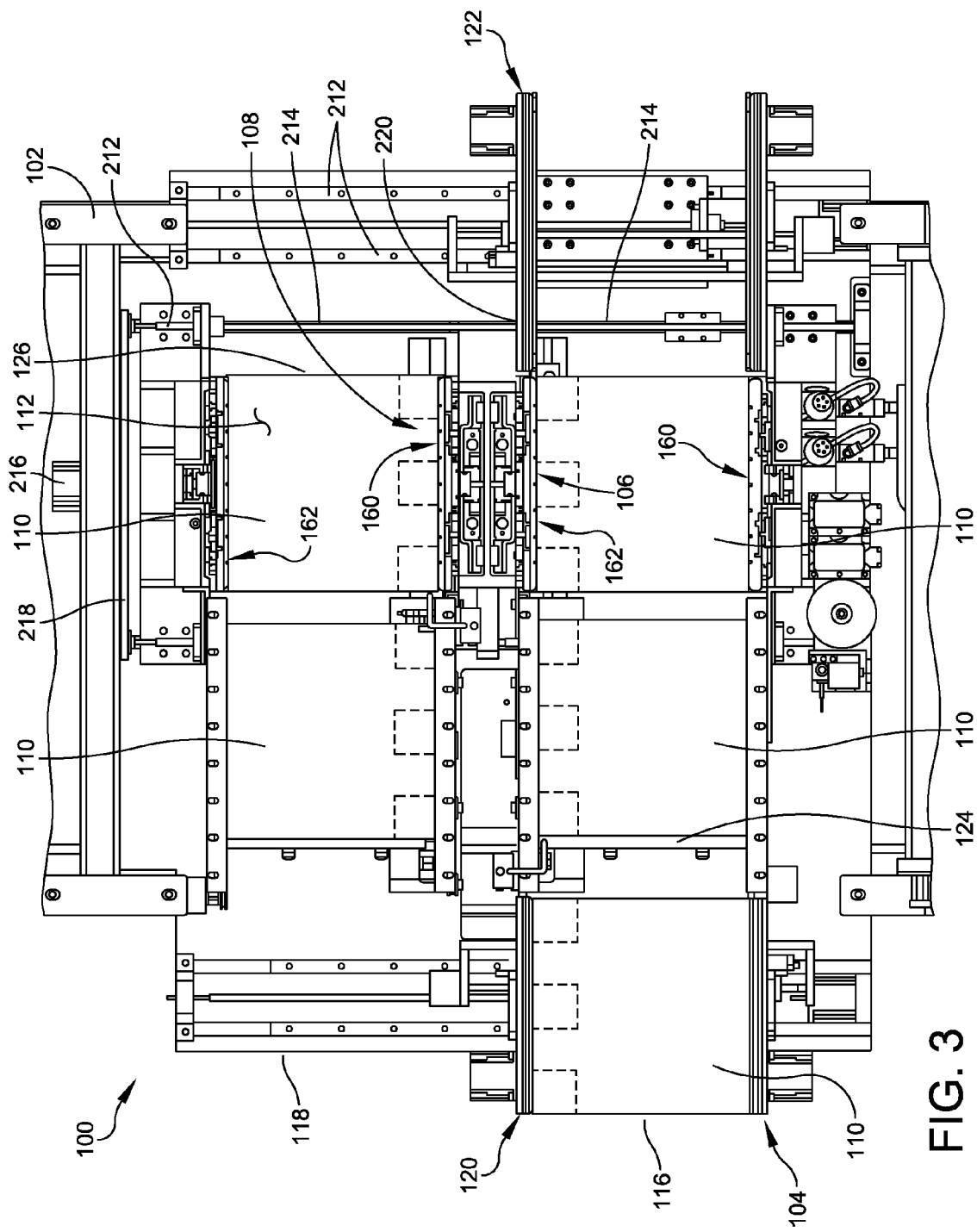
FIG. 3 is a top plan view of the dispenser shown in FIG. 2.

Referring to the drawings, and more particularly to FIGS. 2 and 3, a dispenser of an embodiment of the present disclosure is generally indicated at 100. As shown, the dispenser includes a frame 102, which supports the systems and components of the dispenser, including a transport system generally indicated at 104, which shuttles substrates into and out of the dispenser, a clamping system generally indicated at 106, which clamps the substrates during processing, and an inverter system generally indicated at 108, which operates with the clamping system to invert or flip over the substrates to dispense material on both sides of the substrates. Substrates are indicated at 110 throughout the drawings, with a top surface of the substrate being designated at 112 and a bottom surface of the substrate being designated at 114. Each system includes subassemblies that interact with subassemblies of other systems and other components of the dispenser 100 to move substrates 110 into and out of the dispenser and to dispense material on the substrates. A controller associated with the dispenser 100 is configured to control the operation of the systems of the dispenser. In one embodiment, the controller is similar to and provides the functionality of controller 18 of dispenser 10.

FIG. 3 illustrates the frame 102 and the transport system 104 configured to move substrates 110 along two parallel transport paths, a front transport path 116 located toward a front of the dispenser and a rear transport path 118 located toward a rear of the dispenser. The transport system 104 includes a first, upstream conveyor system generally indicated at 120 provided on the left-hand side of the dispenser 100, which is configured to deliver substrates 110 to the front and rear transport paths 116, 118. Specifically, the upstream conveyor system 120 includes a movable conveyor that is configured to move between a first position in which the movable conveyor is aligned with the front transport path 116 and a second position in which the movable conveyor is aligned with the rear transport path 118. FIGS. 2 and 3 show the movable conveyor of the upstream conveyor system 120 in its first position in which the upstream conveyor system is aligned with the front transport path 116. The transport system 104 further includes a second, downstream conveyor system 122 provided on the right-hand side of the dispenser 100, which is configured to remove substrates 110 from the front and rear transport paths 116, 118. As with the upstream conveyor system 120, the downstream conveyor system 122 includes a movable conveyor that is configured to move between a first position in which the movable conveyor is aligned with the front transport path 116 and a second position in which the movable conveyor is aligned with the rear transport path 118. FIGS. 2 and 3 show the movable conveyor of the downstream conveyor system 122 in its first position in which the downstream conveyor system is aligned with the front transport path 116.

Figure 4:
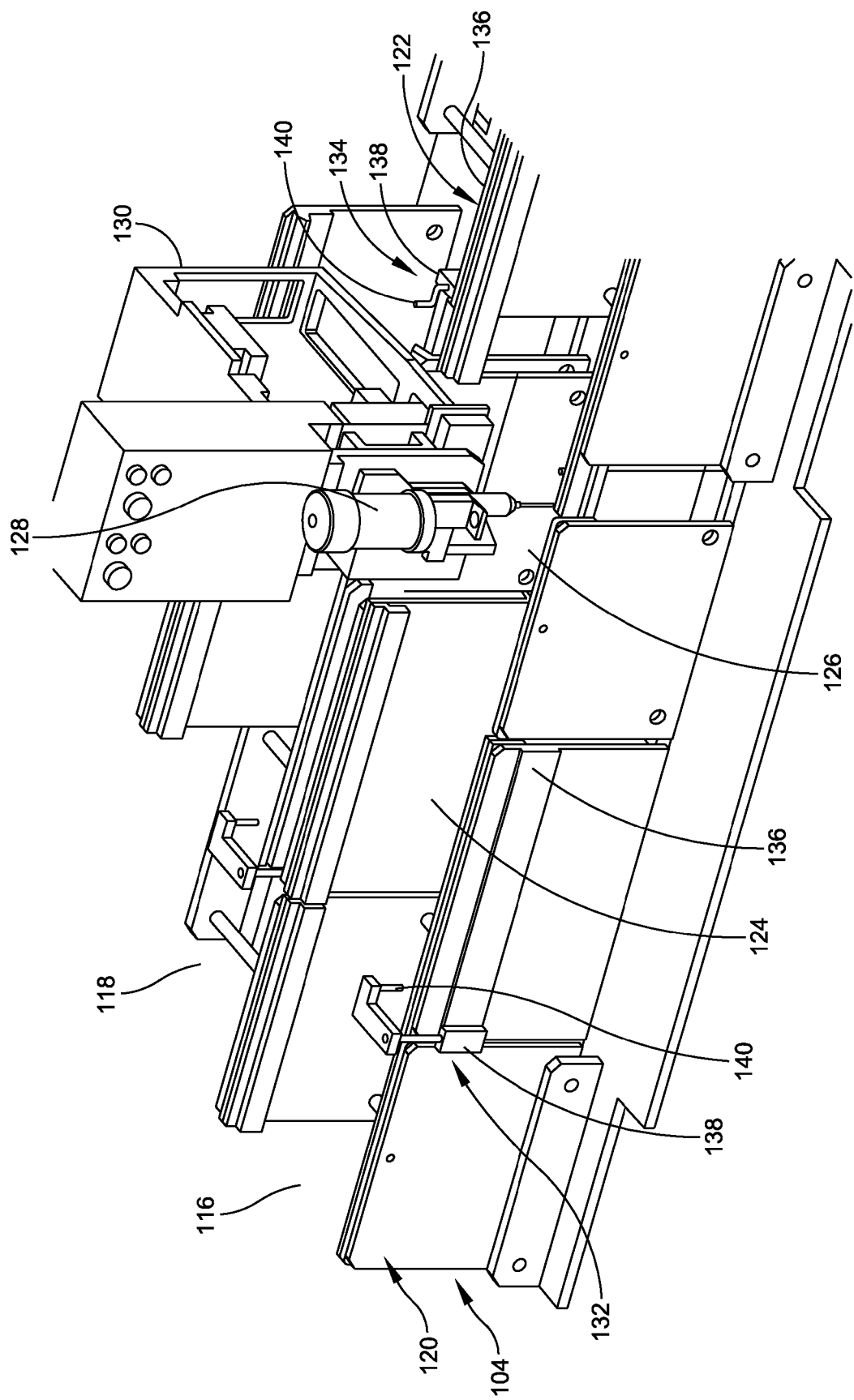
FIG. 4 is an enlarged partial top perspective view of the dispenser.

With additional reference to FIG. 4, for each transport path 116, 118, substrates 110 are delivered by the upstream conveyor system 120 from an upstream system, such as a shuttle loader, to a pre-heat position 124 configured to heat the substrate prior to dispensing. The dispenser 100 includes a pre-heat chuck associated with the front transport path 116 and the rear transport path 118. The substrates 110 are then moved from the pre-heat position 124 to a dispense position 126 by a belt and pusher transport system in which the substrates are positioned under a dispensing unit 128, which is attached to a dispensing unit gantry 130 to move the dispensing unit in the x-axis, y-axis, and z-axis directions. As will be described in greater detail below, for each of the front transport path 116 and the rear transport path 118, the dispensing unit 128 is capable of dispensing material, such as solder paste, on both sides of the substrate 110, with the clamping system 106 holding the substrate in place during the dispensing operation. After dispensing, the substrates 110 are removed from the dispense position 126 by the downstream conveyor system 122 having a belt and pusher transport system to a downstream system, such as a pick-and-place machine or another dispenser.

Figure 5:
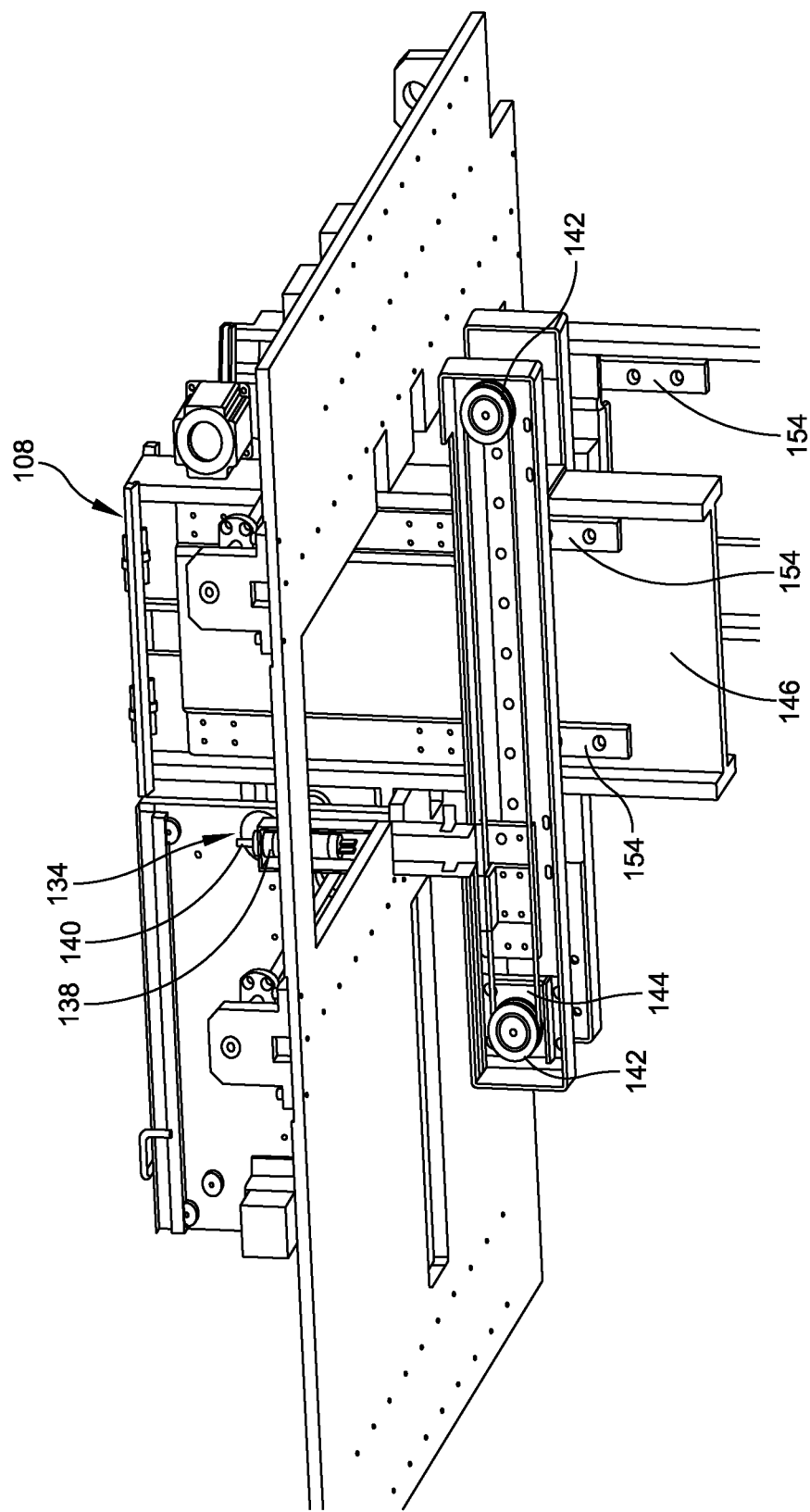
FIG. 5 is an enlarged partial bottom perspective view of the dispenser.
Figure 6:
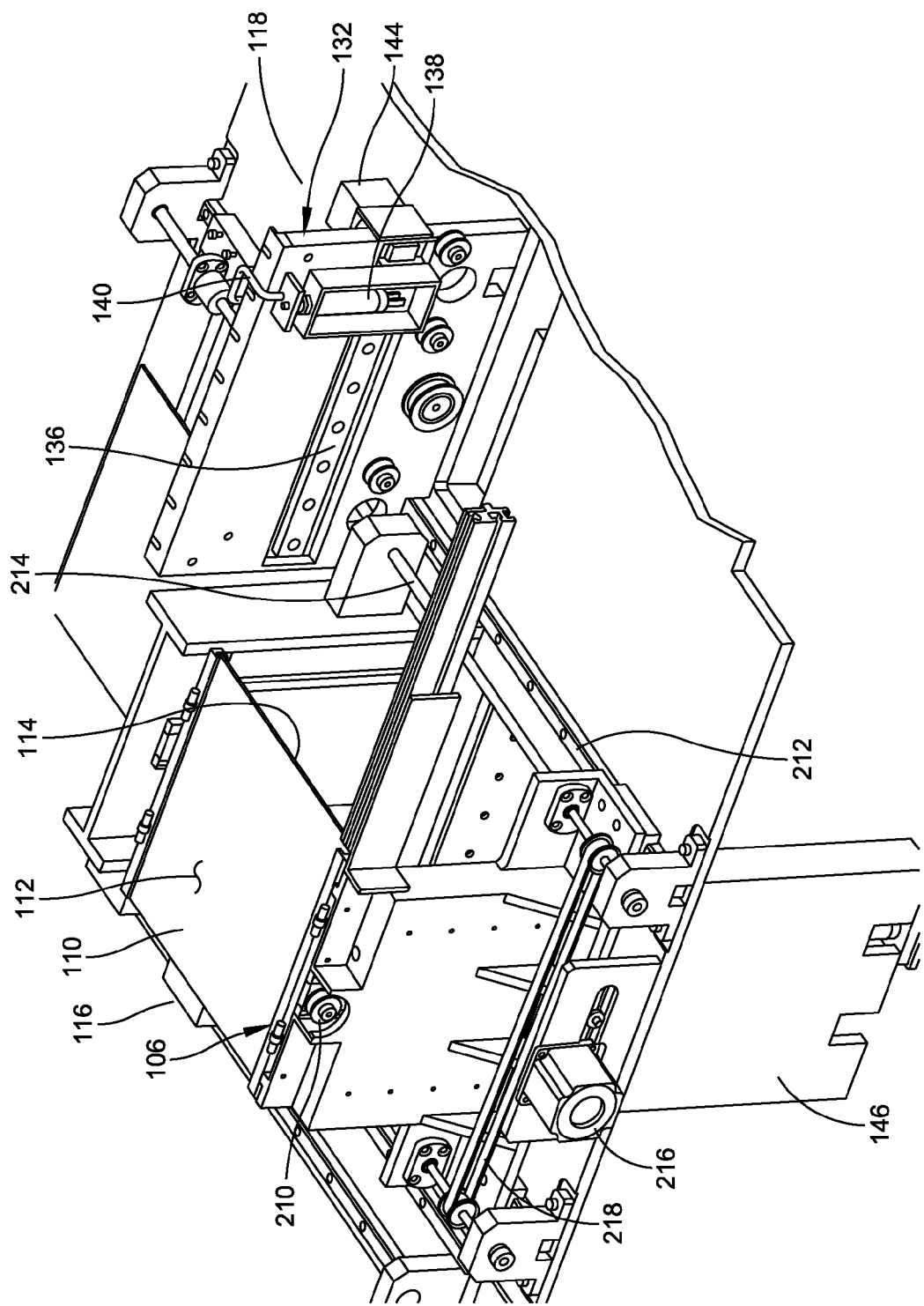
FIG. 6 is another enlarged partial top perspective view of the dispenser taken from the rear of the dispenser having certain components of the dispenser removed to illustrate various aspects of the embodiment.

With additional reference to FIGS. 5 and 6, for each transport path 116, 118, the transport system 104 also includes an upstream substrate pusher assembly generally indicated 132 (FIG. 6), which is configured to move the substrate 110 from the pre-heat position 124 to the dispense position 126 within the dispenser 100, and a downstream substrate pusher assembly generally indicated at 134 (FIG. 5), which is configured to move the substrate from the dispense position to the downstream conveyor system 122, which in turn delivers the substrate to a downstream system, such as another dispenser, or a pick-and-place machine, for example. Although the upstream and downstream pusher assemblies 132, 134 are referred to as "pushers" herein, it should be observed that these components could also be referred to as "pullers" since they also can be configured with grippers to pull the substrates as well, and fall within the scope of the present disclosure. Each pusher assembly 132, 134 employs a linear bearing 136 to move an air cylinder 138 having a pusher member 140 from left to right along the transport path, and is controlled by a belt drive having pulleys each indicated at 142 with a motor 144 provided to drive a belt 143, which rides on the pulleys. The air cylinder 138 for the downstream pusher member 140 extends up from below the substrate to move the substrate.

For the downstream pusher assembly 134, the pusher member 140 parks under the downstream conveyor system 122 during an inversion process described below to clear the way for the clamping system 106 to spin 180 degrees.

Figure 7:
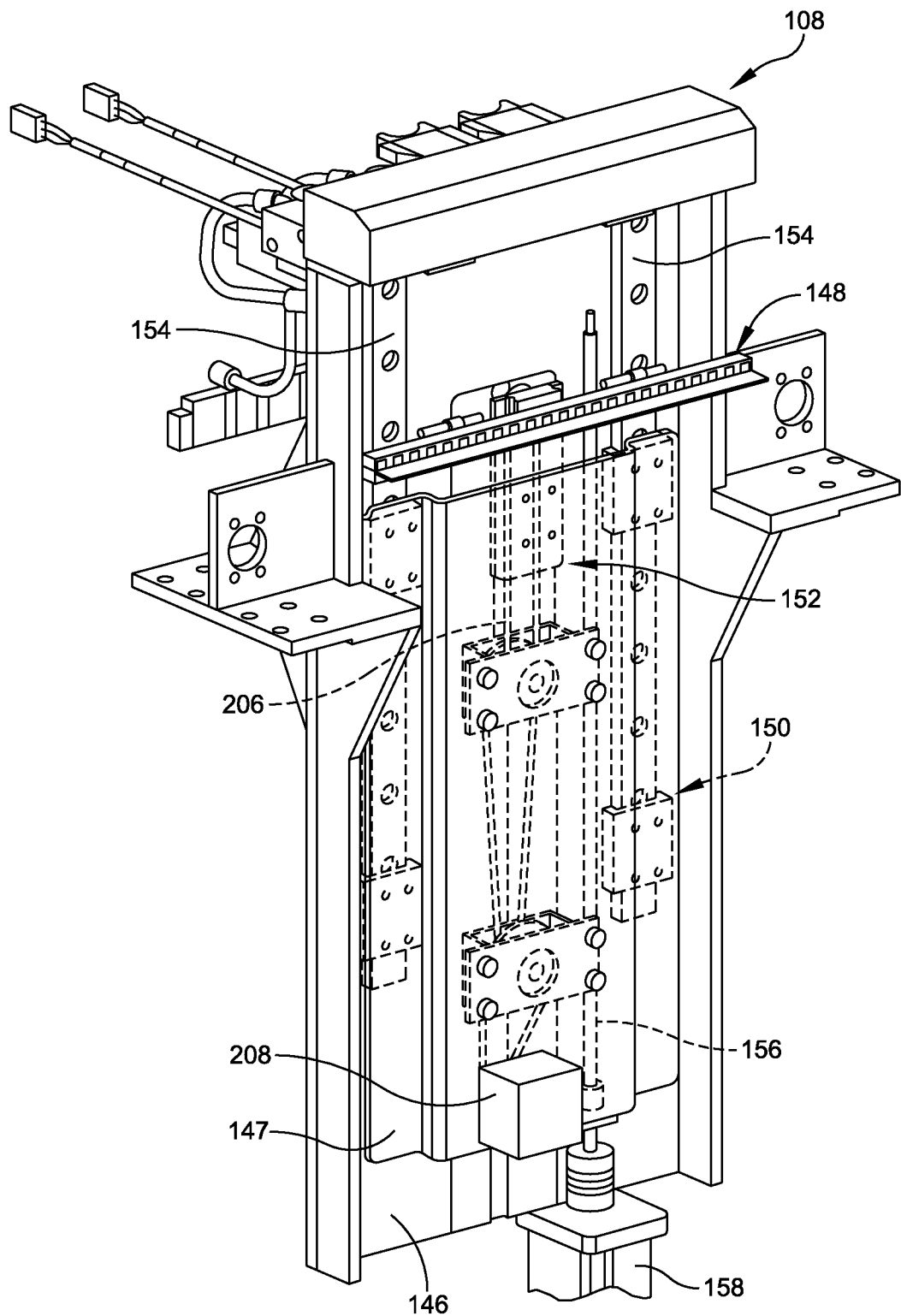
FIG. 7 is a perspective view of the inverter system.

FIG. 7 illustrates the inverter system 108 apart from the remaining components of the dispenser 100. As shown in FIGS. 2-6, the inverter system 108 is configured to move in a z-axis direction with respect to the frame 102 to rotate the clamping system 106 about an axis that is parallel to a y-axis direction between a first position in which the top surface 112 of the substrate 110 is in a dispense position under the dispensing unit 128 and a second position in which a bottom surface 114 of the substrate is in a dispense position. As shown in FIG. 7, for each side of the substrate 110, the inverter system 108 includes a support plate 146, an elevator plate 147 which pivotally supports a clamping assembly generally indicated at 148 of the clamping system 106 provided on top of the elevator plate in a manner described in greater detail below. The inverter system 108 further includes a z-axis drive assembly 150 that is configured to move the elevator plate 147 in the z-axis direction with respect to the support plate 146, and a rotational drive assembly 152 configured to rotate the clamping assembly 148. The z-axis drive assembly 150 includes a pair of spaced-apart z-axis bearings, each indicated at 154, which are mounted on the support plate 146 and coupled to the elevator plate 135 by a z-axis ball screw 156 to move the elevator plate upwards and downwards with respect to the support plate. The z-axis drive assembly 150 further includes a motor 158, which is configured to drive the rotation of ball screw 156. The arrangement is such that the inverter system 108 is capable of driving the up and down movement of the elevator plate 147, the purpose of which will become apparent as the description of the dispenser proceeds. The rotational drive assembly 152 of the inverter system 108 will be described after describing the clamping system 106.

Referring back to FIGS. 2 and 3, the clamping system 106, for each transport path 116, 118, includes a first clamping assembly 160 configured to clamp one edge of the substrate 110 and a mating second clamping assembly 162 configured to clamp an opposite edge of the substrate. The first and second clamping assemblies 160, 162 are configured to firmly secure the substrate 110 during the dispensing and rotational operations and to release the substrate when the substrate is delivered to and removed from the clamping system 106.

Figure 8:
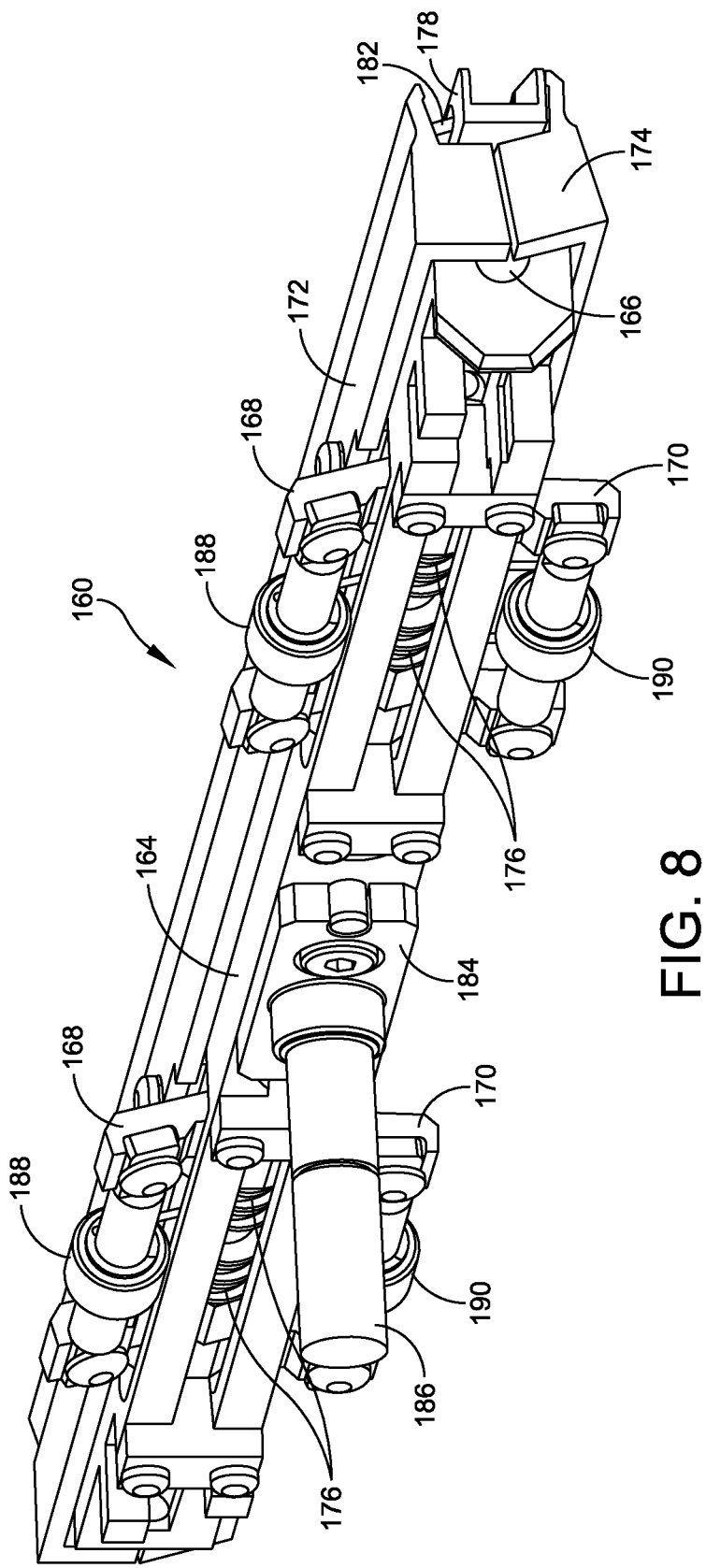
FIG. 8 is a perspective view of the clamping system.
Figure 9:
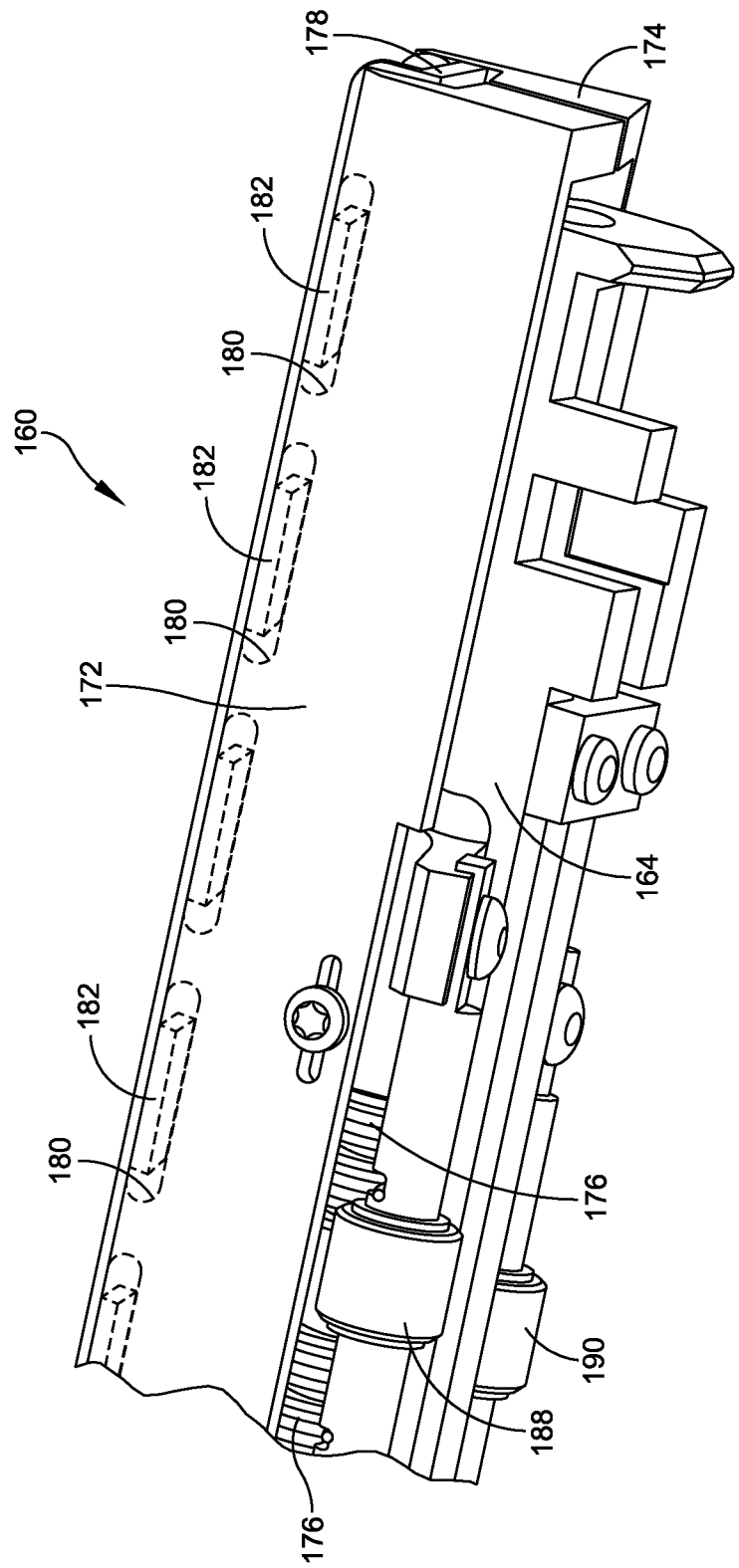
FIG. 9 is a top perspective view of a portion of the clamping system.

Referring to FIGS. 8 and 9, each clamping assembly 160, 162 (with clamping assembly 160 being illustrated in FIGS. 8 and 9) includes a frame structure 164 having a pivot shaft 166, a pair of clamp arms 168, 170, an upper clamping member 172 pivotally connected to the frame structure by clamp arm 170, and a lower clamping member 174 pivotally connected to the frame structure by clamp arm 168. The upper and lower clamping members 172, 174 are designed to move between an open position in which the clamping members are spaced from one another and a clamped position in which the clamping members move toward one another to clamp an edge of the substrate 110 for securing the substrate.

The upper and lower clamping members 172, 174 are connected to a pair of springs, each indicated at 176, to bias the clamping members to the clamped position. Each clamping assembly 160, 162 further includes a clamp jaw 178 positioned between the upper and lower clamping members 172, 174. The springs 176 apply torsional load between the clamp jaw 178 and the pivot shaft 166 to apply the clamping force. The clamp jaw 178 has openings each indicated at 180 formed therein that are sized and configured to receive teeth 182 from the upper and lower clamping members 172, 174 when securing the substrate 110. The frame structure 164 includes a plate 184 having a pivot 186, which extends perpendicularly from the plate. The pivot 186 is included to pivot the clamping assembly 160 or 162 about the pivot to rotate the substrate 110. In one embodiment, the pivot 186 embodies a shaft having an angular contact ball bearing at a free end thereof provided in the elevator plate 147 of the inversion system 108.

Figure 10:
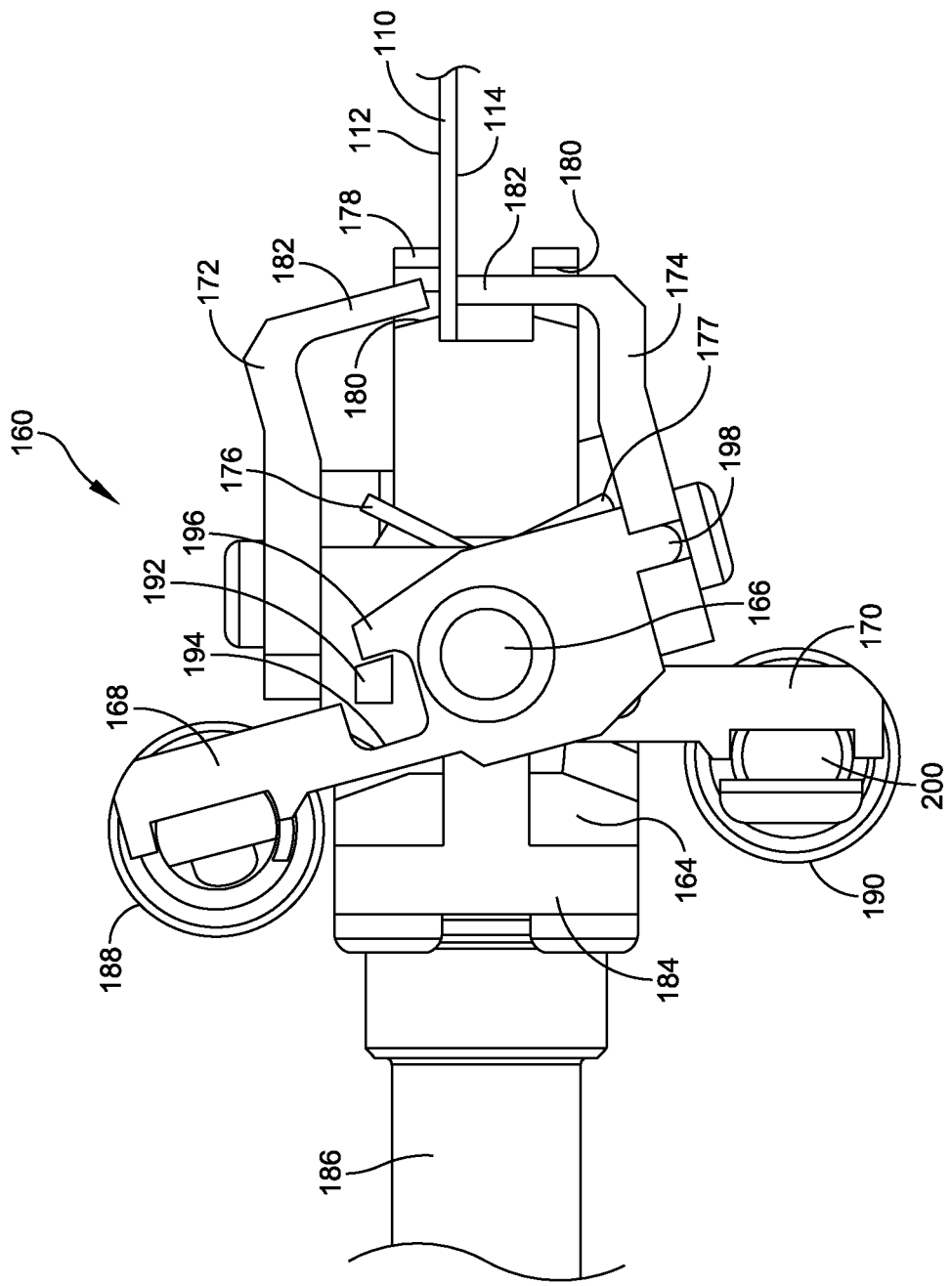
FIG. 10 is an end view of the clamping system.

Referring to FIG. 10, each clamping assembly, e.g., clamping assembly 160, further includes a first (upper) pair of cam followers 188 pivotally connected to the frame structure 164 and the lower clamping member 174 by the clamp arm 168, and a second (lower) pair of cam followers 190 pivotally connected to the frame structure and the upper clamping member 172 by the clamp arm 170. The arrangement is such that each of the first cam followers 188 and the second cam followers 190 is spring biased to maintain the lower clamping member 174 and the upper clamping member 172, respectively, in the clamped position. FIG. 10 illustrates the first and second cam followers 188, 190 floating (i.e., spaced from a cam surface). As shown, the substrate 110 is elevated within the clamp jaw 178 with the lower clamping member 174 engaging the bottom surface 114 of the substrate to raise the substrate within the clamp jaw.

FIG. 10 further illustrates a minimal thickness substrate 110 supported by the clamping assembly 160. Two features are machined into either side of the clamp arm. One feature is a first protrusion 192 that fits into a slot 194. When there is no substrate in the clamping assembly 160, the first protrusion 192 engages a positive stop 196 in the slot 194. The first protrusion 192 takes up the load provided by the springs 176 so that the clamp teeth 182 as shown do not push against each thereby other causing deformation and premature wear. The other feature is a second protrusion 198, and is machined into the clamp arm 168 that engages with the lower clamping member 174. This second protrusion 198 maintains the upper and lower clamping members 172, 174 of the clamping assembly 160 aligned so that the clamp teeth 182 are received within their respective openings 180 formed in the clamp jaw 178. For thicker substrates 110, there is added clearance with the positive stops 196. As shown, the positive stops 196 are engaged with each other and that there is a gap between the teeth 182.

One spring 176 may be selected to be a stronger spring, with an end of the stronger spring engaging a cam follower shaft 200 and an opposite end of the stronger spring engaging the clamp jaw 178. The stronger spring 176 in this orientation causes one clamp arm 168 to engage the protrusion 192 and slot on the second arm lifting the opposing lower clamping member 174. The other spring 177 may be selected to be a weaker spring in this instance. The purpose of selecting different spring values enables the clamping members 172, 174 to consistently position the substrate to the top or bottom surface of the clamp jaw when the cam followers are off the cam during inversion of the substrate.

Figure 11:
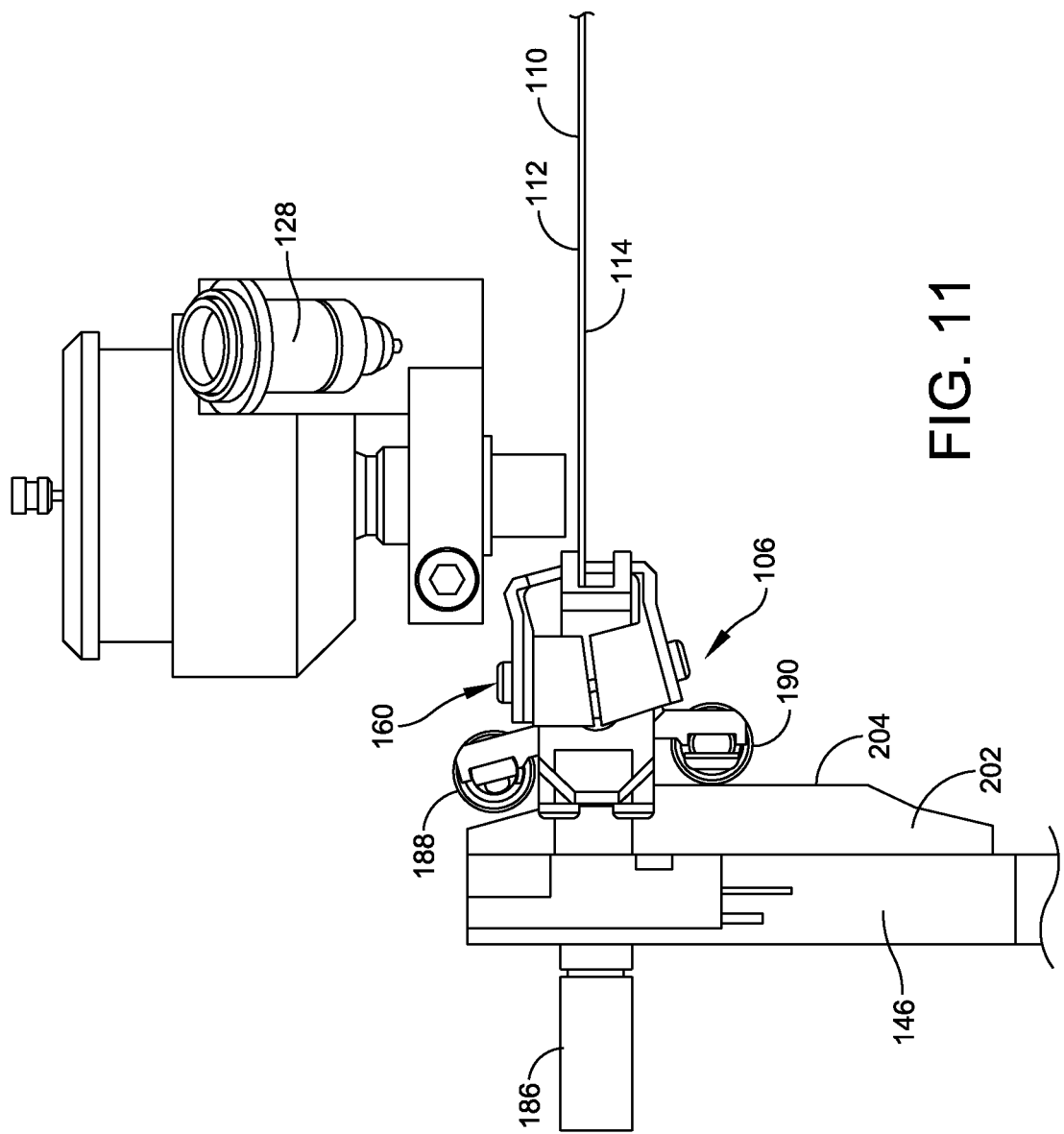
FIG. 11 is an end view of the clamping system and a dispensing unit of the dispenser with a substrate being shown in a dispense position.

Referring to FIG. 11, the clamping assembly 160 is shown with the dispensing unit 128. As shown, the dispensing unit 128 is configured to dispense material adjacent an edge of the substrate 110. The closeness of the dispensing unit 128 to the edge of the substrate 110 is achieved by use of the clamping system 106 and the inverter system 108. The clamping assembly 160 further includes a cam 202 that is secured to the frame 102 of the dispenser 100. The first cam follower 188 is off of the cam 202, which enables the spring 176 of the lower clamp member 174 to force the substrate 110 up to a top surface of the clamp jaw 178. The second cam follower 190 remains on a rise 204 of the cam 202 to cause the upper clamping member 172 to retract so that upper clamping member does not interfere with the lower clamping member 174 thereby justifying the substrate 110 to a repeatable and upward justified position for dispensing.

Figure 12:
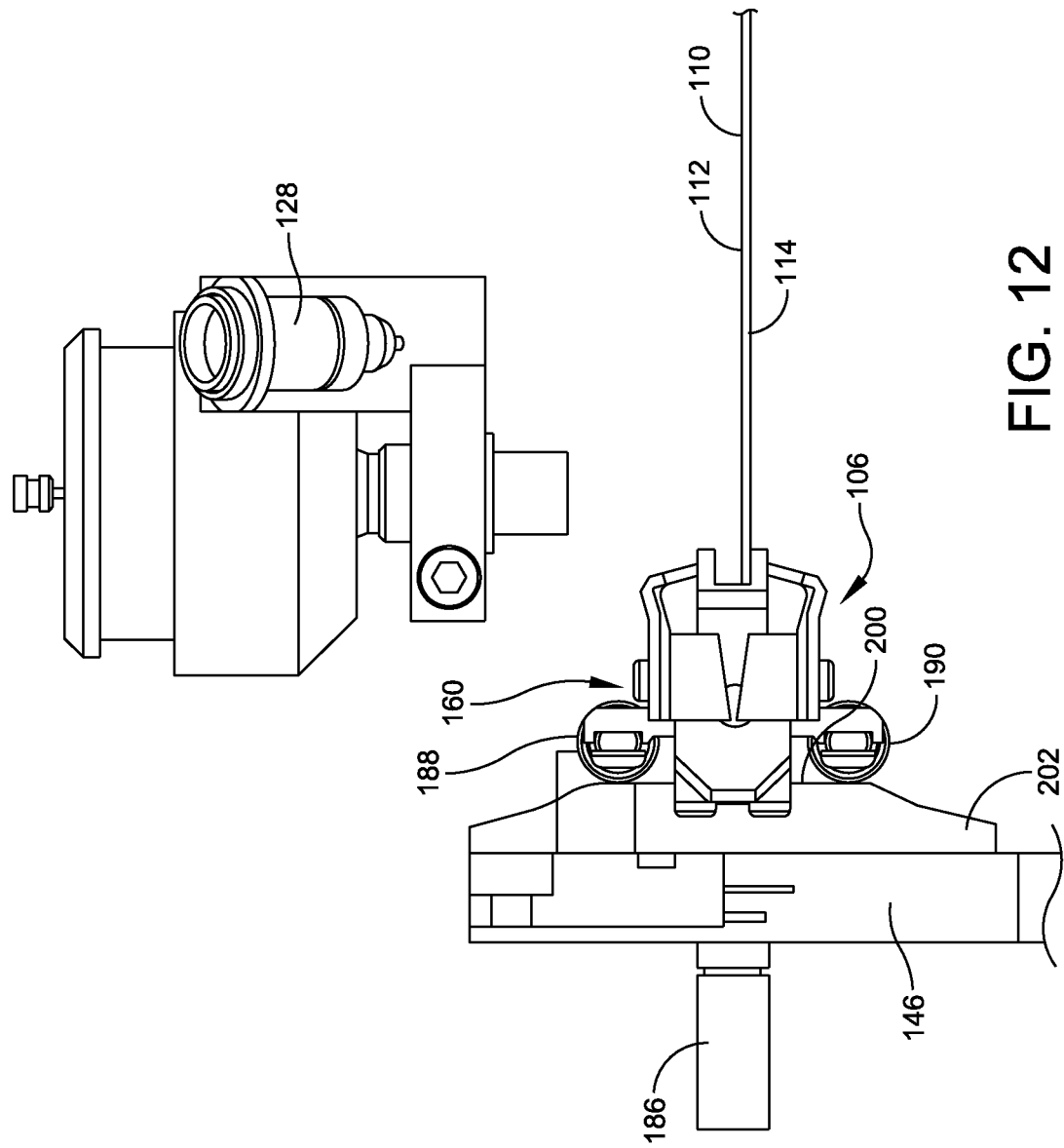
FIG. 12 is an end view of the clamping system and the dispensing unit with the substrate being shown in a transport position.

Referring to FIG. 12, both the first and second cam followers 188, 190 are engaging the rise 204 on the cam 202 to cause the retraction of both of the lower and upper clamping members 172, 174. In this position, with both of the clamping members 172, 174 retracted, the substrate 110 can be freely transported into and out of the clamping assembly 160. As shown, the substrate 110 is disposed toward a bottom of the clamp jaw 178 at a transport height.

Figure 13:
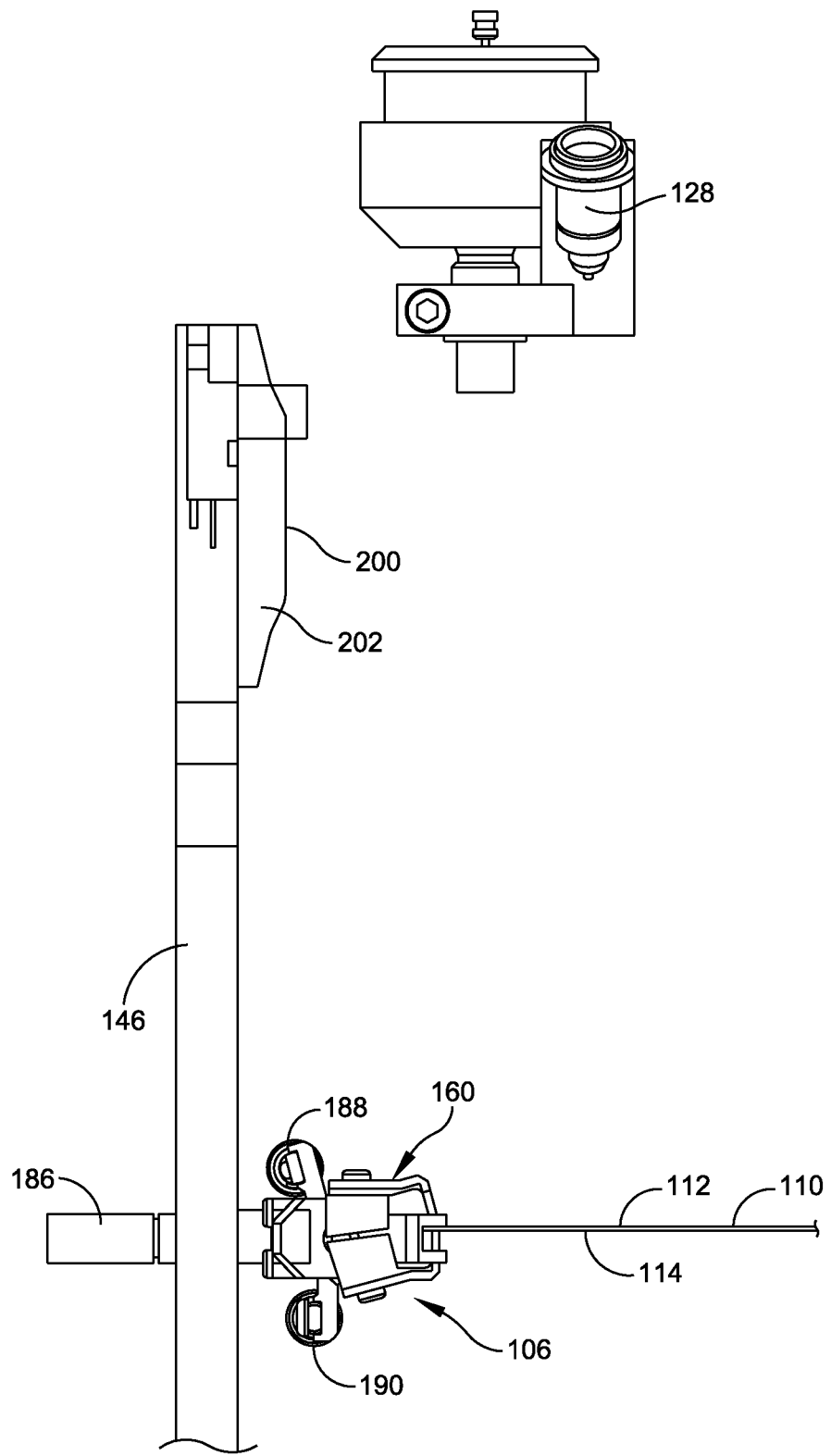
FIG. 13 is an end view of the clamping system and the dispensing unit with the substrate being shown in an inverting position.

Referring to FIG. 13, the clamping assembly 160 of the clamping system 106 is shown in a lowered position by the z-axis drive assembly 150 of the inverter system 108. The other clamping assembly, i.e., clamping assembly 162, which secures the other side of the substrate 110, is not shown, but in a similarly lowered position. In this position, the clamping assembly 160 of the clamping system 106 and the substrate 110 can be rotated to position the bottom surface 114 of the substrate in an upwardly facing position. In the lowered position, both the first and second cam followers 188, 190 are off of the cam 202 so the springs 176, 177 for the clamping members 172, 174 are acting on the substrate 110 to clamp the substrate. The substrate 110 is pushed to one side of the clamp jaw 178, with the same side of the clamp jaw for both front and rear clamp jaw so that the substrate is not distorted. The means of justifying this is to use springs 176,177 that are twice as strong on one side so there is never doubt as to where the substrate 110 is positioned when inverting the substrate.

Referring back to FIGS. 4-7, the inverter system 108 is capable of rotating the substrate 110 so that the bottom surface 114 of the substrate faces upwardly so that the dispensing unit 128 can dispense material on the bottom surface. During an inversion process, the substrate 110 is lowered by the inversion system 106 to an inversion position. In a certain embodiment, a maximum size of the substrate 110 is approximately ten inches by ten inches. Thus, for a substrate having a length and width of ten inches by ten inches, a rotation path of the substrate would be ten inches wide and ten inches long. The arrangement is such that the substrate 110 is secured by the clamping system 106, with clamping assemblies 160, 162 being lowered so that the clamping members 172, 174 clamp the substrate securely. Once in the lowered position, otherwise referred to as the inversion position, the inverter system 108 rotates the clamping assemblies 160, 162 so that the bottom surface 114 of the substrate 110 faces upwardly.

To rotate the clamping assemblies 160, 162, the rotational drive assembly 152 of the inverter system 108 includes a belt 206 connected to the pivot 186 of the frame structure 164 of each clamping assembly. The belt 206 is driven by a suitable motor 208, which in one embodiment has a 10:1 drive ratio. The pivot 186 fits into the angular contact bearing that is mounted to the moving z-axis elevator plate 147 of the inversion system 108. The pivot 186 includes a pulley 210 that mounted near an end of the pivot, with the belt 206 driving the rotation of the clamping assembly 160 or 162. As shown, each side of the substrate 110 is engaged by the clamping assembly 160 or 162, with the support plate 146, the clamping assembly (160 or 162), and the rotational drive assembly 152 operating together in a synchronized manner to clamp and rotate the substrate.

To adjust a transport width, linear bearings, each indicated at 212, are provided at a transport width of the dispenser. There are four other linear bearings 212, which are not identified, for the upstream and downstream conveyor systems 120, 122. Just above the linear bearings 212 are ball screws, each indicated at 214, which drive the transport width by a motor 216 and a belt drive 218 from the rear. There is a junction point 220 between the two ball screws 214, a right hand ball screw and a left hand ball screw. The provision of two ball screws 214 enables a width of both lanes or paths to be simultaneously moved to the same substrate size.

Figure 14:
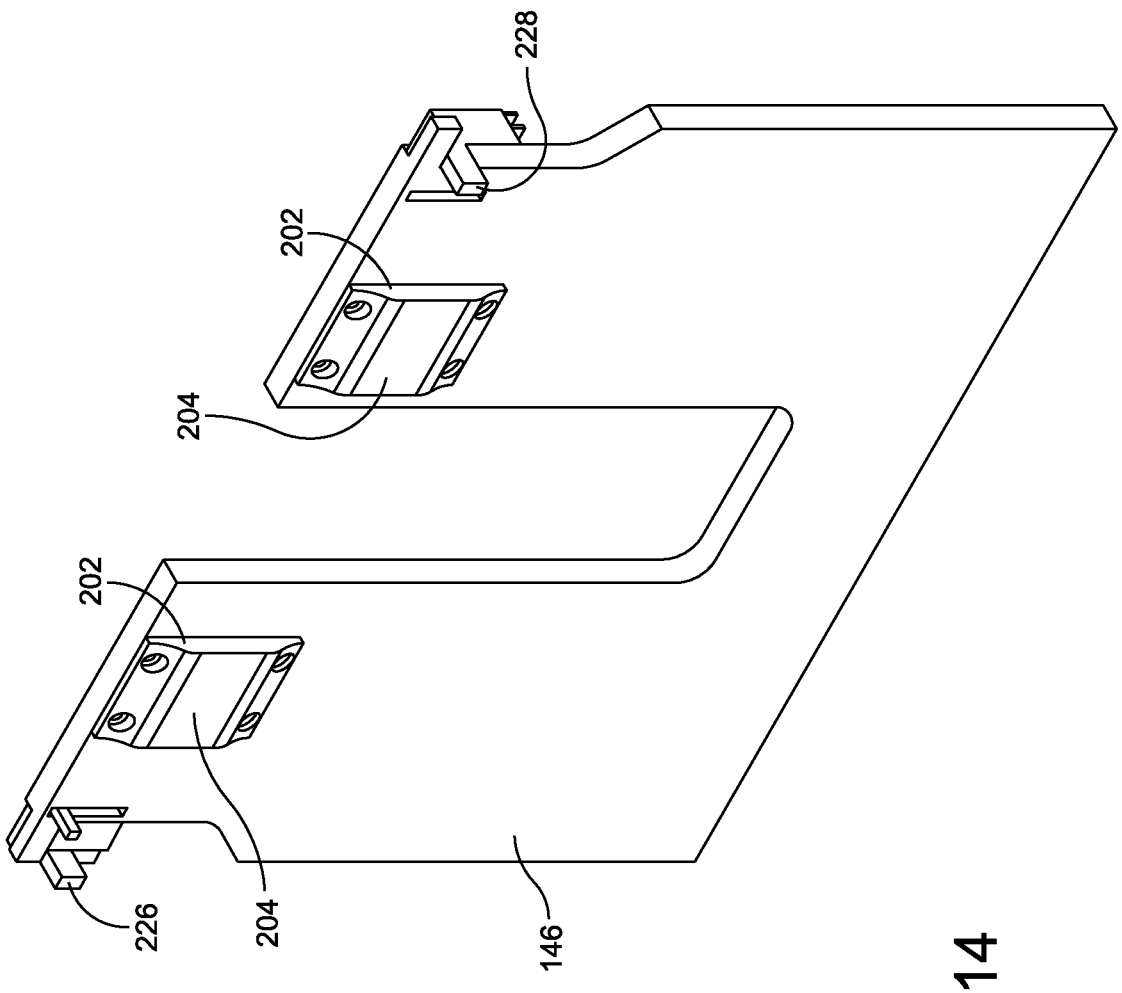
FIG. 14 is a perspective view of a support plate of the inverter system having two cams mounted on the support plate.

Referring to FIG. 14, the support plate 146 of the inverter system 108 has two cams 202 mounted on the support plate. The cams 202 of the clamping and inverter systems 106, 108 include a home sensor 226 and a rotation safe sensor 228 that are provided adjacent the respective cams. These sensors 226, 228 pick up or otherwise detect a flag or a structural feature, which is attached to or otherwise associated with the clamp jaw 178. The home sensor 226 detects an orientation of the clamp jaw 178 and therefore which side of the substrate 110 is facing upwardly to enable the springs 176,177 to be properly orientated. The safe sensor 228 in conjunction with the home sensor 226 enables the verification of whether the clamp jaw 178 is horizontal prior to attempting to drive the cam followers 188, 190 over the cams 202—thus, preventing damage of the clamping system 106 if the clamp assemblies 160, 162 are not oriented properly.

During operation, the upstream conveyor system delivers substrates to the front and rear transport paths through the dispenser. Specifically, the movable conveyor of the upstream conveyor system is aligned with one of the transport paths, e.g., the front transport path, to deliver the substrate to the pre-heat position. Once in the pre-heat position, the substrate is moved to the dispense position by the upstream substrate pusher and heat zone conveyors of the transport system. The dispensing unit performs a dispense operation on the top surface of the substrate. When completed, the substrate is lowered, rotated so that the bottom surface of the substrate faces upwardly, and raised to the dispense position by the inverter system. The dispensing unit then performs a dispense operation on the bottom surface of the substrate. When completed, the substrate is removed from the dispense position by the downstream pusher and shuttle conveyor system.

After delivering the substrate, the movable conveyor of the upstream conveyor system receives another substrate, and moves so that the upstream conveyor system is aligned with the other transport path, e.g., the rear transport path, to deliver the substrate to the pre-heat position. This substrate travels from the pre-heat position to the dispense position in a similar manner, where a dispense operation can take place on both the top and bottom surfaces of the substrate. This substrate is also removed from the dispense position by the downstream conveyor system.

Prior to performing the dispense operation on the top surface of the substrate, the operation includes clamping opposing edges of the substrate with the clamping system. The clamping of the opposing edges of the substrate is achieved by raising the substrate to the dispense position so that spring-biased clamping members of the clamping system engage the substrate. Prior to removing the substrate from the substrate support assembly, the operation includes unclamping the opposing edges of the substrate. The unclamping of the opposing edges of the substrate is achieved by lowering the substrate from the dispense position to the transport height so that spring-biased clamping members of the clamping system disengage the substrate.

As discussed above, the foregoing operations may be controlled by a controller, such as controller 18 referenced with dispenser 10.

Having thus described at least one embodiment of the disclosure, various alternations, modifications and improvements will readily occur to those skilled in the art. Such alterations, modifications and improvements are intended to be within the scope and spirit of the disclosure. Accordingly, the foregoing description is by way of example only and is not intended to be limiting. The limit is defined only in the following claims and equivalents thereto.

What is claimed is:

1. A dispensing apparatus for dispensing viscous material on a substrate having a top surface and a bottom surface, the dispenser comprising:
   a frame;
   a gantry system coupled to the frame;
   a dispenser coupled to the gantry system, the gantry system being configured to move the dispensing unit in x-axis, y-axis, and z-axis directions; and
   a substrate support assembly coupled to the frame and configured to support the substrate in a dispense position to dispense material on the top surface of the substrate and on the bottom surface of the substrate, the substrate support assembly being disposed below the dispensing unit, the substrate support assembly including
      a clamping system configured to receive and support the substrate in the dispense position and to secure the substrate during a dispense operation in which the dispenser is used to dispense viscous material on the substrate, the clamping system including a first clamping assembly configured to clamp one edge of the substrate and a second clamping assembly configured to clamp an opposite edge of the substrate, each clamping assembly including an upper clamping member and a lower clamping member, the upper and lower clamping members being configured to secure an edge of the substrate, the upper and lower clamping members being connected to at least one spring to bias the clamping members to the clamped position, each clamping assembly further including a clamp jaw positioned between the upper and lower clamping members, the at least one spring applying a torsional load to at least one of the upper and lower clamping members to apply a clamping force on the substrate to position the substrate within the clamp jaw, and
      an inverter coupled to the frame and the clamping system, the inverter being configured to rotate the clamping system about an axis that is parallel to the y-axis direction between a first position in which the top surface of the substrate is in the dispense position and the dispenser dispenses viscous material on the top surface of the substrate and a second position in which the bottom surface of the substrate is in the dispense position and the dispenser dispenses viscous material on the bottom surface of the substrate.

2. The dispensing apparatus of claim 1, wherein the inverter further is configured to move in a z-axis direction.

3. The dispensing apparatus of claim 2, wherein the inverter includes a support plate, an elevator plate movably coupled to the support plate, a z-axis drive assembly configured to move the elevator plate in the z-axis direction with respect to the support plate, and a rotational drive assembly configured to rotate the clamping system.

4. The dispensing apparatus of claim 3, wherein the z-axis drive assembly includes at least one bearing coupled to the frame by a ball screw, and a motor configured to drive the rotation of the ball screw to move the elevator plate with respect to the support plate.

5. The dispensing apparatus of claim 3, wherein, for each of the first clamping assembly and the second clamping assembly, the rotational drive assembly includes a pivot, a belt coupled to the pivot, and a motor configured to drive the belt to rotate the pivot.

6. The dispensing apparatus of claim 1, wherein the upper clamping member includes a first cam follower configured to engage a rise on a cam provided on the support to move the upper clamp to an open position, and the lower clamping member includes a second cam follower configured to engage the cam to move the lower clamping member to an open position.

7. The dispensing apparatus of claim 6, wherein when the upper clamping member or the lower clamping member are in the clamping position, the substrate supported by the clamping system is in a top justified position within the clamp jaw.

8. The dispensing apparatus of claim 7, further including at least one sensor configured to determine an orientation of at least one of the upper clamping member and the lower clamping member.

9. The dispensing apparatus of claim 1, wherein the substrate support assembly includes two lanes, a front lane and a rear lane, and wherein the dispensing apparatus further comprises an upstream conveyor system configured to deliver substrates to the front and rear lanes of the dispensing apparatus and a downstream conveyor system configured to remove substrates from the front and rear lanes of the dispensing apparatus.

\* \* \* \* \*